US008797087B2

(12) United States Patent
Schimper

(10) Patent No.: US 8,797,087 B2
(45) Date of Patent: Aug. 5, 2014

(54) REFERENCE QUANTITY GENERATOR

(75) Inventor: Markus Schimper, Moosinnig (DE)

(73) Assignee: Intel Mobile Communications GmbH, Neubiberg (DE)

(*) Notice: Subject to any disclaimer, the term of this patent is extended or adjusted under 35 U.S.C. 154(b) by 184 days.

(21) Appl. No.: 13/168,050

(22) Filed: Jun. 24, 2011

(65) Prior Publication Data

US 2012/0326759 A1 Dec. 27, 2012

(51) Int. Cl.
*H02M 3/157* (2006.01)
*G05F 1/575* (2006.01)
*H03L 5/00* (2006.01)

(52) U.S. Cl.
USPC ............ 327/530; 327/540; 323/313; 323/315

(58) Field of Classification Search
None
See application file for complete search history.

(56) References Cited

U.S. PATENT DOCUMENTS 5,483,150 A 1/1996 Elliott et al.
6,181,187 B1 * 1/2001 Daffron et al. ................ 327/323
6,392,490 B1 5/2002 Gramegna et al.
6,833,729 B2 * 12/2004 Kim et al. ........................ 326/30
7,119,606 B2 * 10/2006 Fahim ........................... 327/541
7,148,720 B2 * 12/2006 Chen ............................... 326/30
7,498,779 B2 * 3/2009 Vorenkamp ................... 323/272
7,675,757 B2 * 3/2010 Nakamura ...................... 363/15
2003/0155650 A1 8/2003 Moon et al.
2006/0186950 A1 8/2006 Jung
2010/0270869 A1 10/2010 Vorenkamp

* cited by examiner

*Primary Examiner* — Lincoln Donovan
*Assistant Examiner* — Terry L Englund
(74) *Attorney, Agent, or Firm* — Eschweiler & Associates, LLC

(57) ABSTRACT

A reference quantity generator for generating a reference quantity includes a reference source configured to provide a reference source signal, a digitally controlled signal source and a digital controller. The digitally controlled signal source is configured to provide a digitally controlled quantity. The reference quantity is determined based on the digitally controlled quantity. The digital controller is configured to provide a digital control signal to control the digitally controlled signal source to adapt the digitally controlled quantity based on the reference source signal using a feedback.

18 Claims, 10 Drawing Sheets

REFERENCE QUANTITY GENERATOR

FIELD

Embodiments of the present invention relate to a reference quantity generator, such as a reference current generator, a reference voltage generator, or the like. Some embodiments of the present invention relate to a method for generating a reference quantity.

BACKGROUND

Many systems that manipulate and generate analog and/or digital signals need precise, stable voltage and current references defining bias points for these signals. In many cases, these voltage references must be in addition to and independent of a supply voltage for the circuit. Some of these applications are in areas such as, sense amplifiers, input signal level sensors, phase locked loops, delay locked loops, wireless receivers, analog-to-digital converters, digital-to-analog converters, and various other circuits.

SUMMARY

Embodiments of the present invention provide a reference quantity generator for generating a reference quantity. The reference quantity generator comprises a reference source, a digitally controlled signal source, and a digital controller. The reference source is configured to provide a reference source signal. The digitally controlled signal source is configured to provide a digitally controlled quantity, and the reference quantity is determined based on the digitally controlled quantity. The digital controller is configured to provide a digital control signal for controlling the digitally controlled signal source to adapt the digitally controlled quantity based on the reference source signal using a feedback.

Further embodiments of the present invention provide a reference quantity generator for generating a reference quantity. The reference quantity generator comprises a reference source and an analog-and-digital control loop. The reference source is configured to provide a reference source signal. The analog-and-digital control loop is configured to receive an analog setpoint signal that is a function of, or depends on, the reference source signal. The analog setpoint signal may be equal to the reference source signal. The analog-and-digital control loop is further configured to provide the reference quantity using a feedback and a digital control, wherein a noise measure of the analog-and-digital control loop is lower than a noise measure of the reference source.

Furthermore, embodiments of the present invention provide a reference quantity generator for generating a reference quantity. The reference quantity generator comprises means for providing a reference source signal, means for providing a digitally controlled quantity, means for determining the reference quantity based on the digitally controlled quantity, and means for providing a digital control signal for the means for providing the digitally controlled quantity, in order to adapt the digitally controlled quantity based on the reference source signal using a feedback.

Further embodiments of the present invention provide a method for generating a reference quantity. The method comprises providing a reference source signal, and determining, using a feedback, a digital control signal based on the reference source signal. The method further comprises determining a digitally controlled quantity based on the digital control signal, and determining the reference quantity based on the digitally controlled quantity. The feedback is based on the reference quantity or on an associated quantity and is provided to adapt the digitally controlled quantity based on the reference source signal.

Furthermore, embodiments of the present invention provide a method for generating a reference quantity. The method comprises providing a reference source signal, and performing a closed loop control using an analog-and-digital control loop. Performing the closed loop control comprises receiving a setpoint signal that is a function of, or depends on, the reference source signal, and providing the reference quantity using a feedback and a digital control, wherein a noise measure of the analog-and-digital control loop is lower than a noise measure of the reference source signal.

BRIEF DESCRIPTION OF THE DRAWINGS

Embodiments of the present invention are described herein, making reference to the appended drawings.

Equal or equivalent elements or elements with equal or equivalent functionality are denoted in the following description by equal or similar reference numerals.

DETAILED DESCRIPTION

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 1:
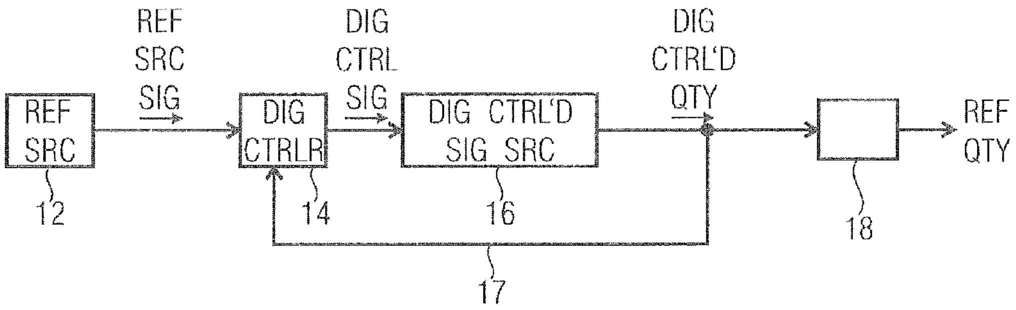
FIG. 1 shows a schematic block diagram of a reference quantity generator according to a first embodiment of the teachings disclosed herein.

FIG. 1 shows a schematic block diagram of a reference quantity generator according to a first embodiment of the teachings disclosed herein. The reference quantity generator comprises a reference source 12, a digital controller 14, and a digitally controlled signal source 16. The reference source 12 is configured to provide a reference source signal (REF SRC SIG), in the case of the first embodiment, directly to the digital controller 14. The digital controller 14 generates a digital control signal (DIG CTRL SIG) and provides the signal to the digitally controlled signal source 16. A digitally controlled quantity (DIG CTRL'D QTY) is generated and is available at an output of the digitally controlled signal source 16. By means of a signal converter (SC) 18, the digitally controlled quantity may be converted to the reference quantity, such as a digitally calibrated ultra low noise reference for current mirrors, for example. Note that the digitally controlled quantity may be the reference quantity already, in which case the signal converter 18 may not be needed.

The digitally controlled quantity is fed back from the output of the digitally controlled signal source 16 to the digital controller 14 by means of a feedback structure 17. The digital controller 14 may use the digitally controlled quantity received via the feedback structure 17 to adapt the digitally controlled quantity via the digital control signal based on the reference source signal. In fact, the digitally controlled signal source 16 may be subject to variations due to e.g., temperature variations, aging, supply voltage variations, etc., even if the reference source signal is relatively accurate and relatively stable. The digitally controlled quantity might vary considerably if the varying operating conditions of the digitally controlled signal source 16 are not accounted for. The digital controller 14 is configured to adjust the digital control signal in order to cause the digitally controlled signal source 16 to generate another value of the digitally controlled quantity which is closer to a current value of the reference source signal, may be even as close to the current value of the reference source signal as possible in view of an amplitude resolution of the digitally controlled signal source 16.

A reference quantity generator as schematically depicted in FIG. 1 may be useful to convert the reference source signal provided by the reference source 12 from a first physical quantity (e.g., electrical current) to a second physical quantity (e.g., electrical voltage). As another example, the reference source 12 may be capable of generating the reference source signal having a specific value only, due to physical realities. In case one or more other values are needed as reference quantity or reference quantities, the reference quantity generator may be used to adapt the reference source signal to the desired reference quantity. For example, the reference source 12 may be based on a specific physical phenomenon, such as a band gap voltage, which is imposed by said physical phenomenon, dimension, structure, and/or material of the reference source 12. A plurality of reference quantity generators might be used to generate a plurality of reference quantities based on a single reference source signal provided by a single reference source 12. In this manner, the plurality of reference quantities is relatively coherent. Lastly, the reference quantity generator may be used to boost or amplify the reference source signal in case the reference source 12 is not capable of providing enough power for all the consumers that are to be supplied with the reference source signal.

Figure 2:
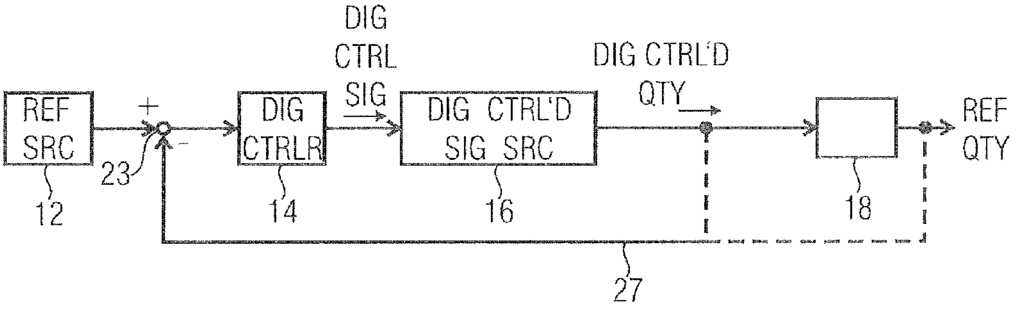
FIG. 2 shows a schematic block diagram of a reference quantity generator according to a second embodiment of the teachings disclosed herein.

FIG. 2 shows a schematic block diagram of a reference quantity generator according to a second embodiment of the teachings disclosed herein. The second embodiment differs from the first embodiment in that a summing point 23 has been inserted between the reference source 12 and the digital controller 14. At the summing point 23 a feedback signal conveyed by a feedback structure 27 is subtracted from the reference source signal. The result of the subtraction corresponds to a deviation between the reference source signal and either the digitally controlled quantity or the reference quantity, as illustrated by the parts of the feedback structure 27 drawn in dashed line.

Figure 3:
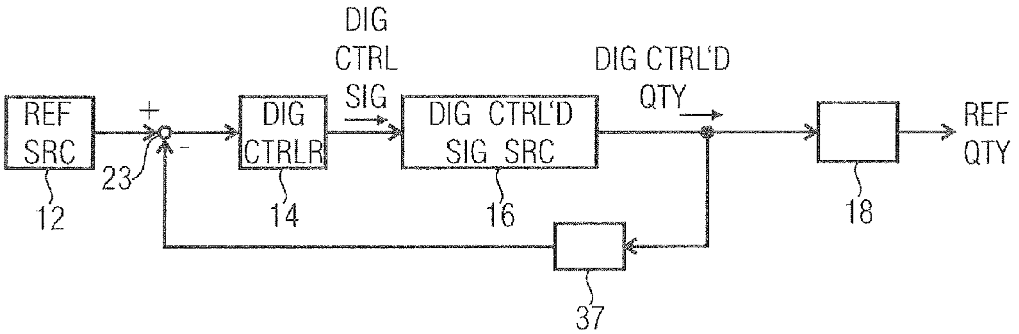
FIG. 3 shows a schematic block diagram of a reference quantity generator according to a third embodiment of the teachings disclosed herein.

FIG. 3 shows a schematic block diagram of a reference quantity generator according to a third embodiment of the disclosed teachings. The third embodiment resembles the second embodiment with the exception that the feedback structure comprises a feedback conditioning element (FCE) 37. The feedback conditioning element 37 may be configured to determine a quantity which is derived from, or proportional to, the digitally controlled quantity. The feedback conditioning element 37 allows the digitally controlled quantity to be of a different signal type than the reference source signal in case a (indirect) comparison of the reference source signal and the digitally controlled quantity is to be made. Thus, the digitally controlled quantity may be, for example, in another amplitude range than the reference source signal or exhibit an (intentional) offset to the reference source signal. Although not illustrated in FIG. 3, an input of the feedback conditioning element 37 may be configured to receive the reference quantity instead of the digitally controlled quantity or in addition thereto, as illustrated in the dashed line of FIG. 2.

Figure 4:
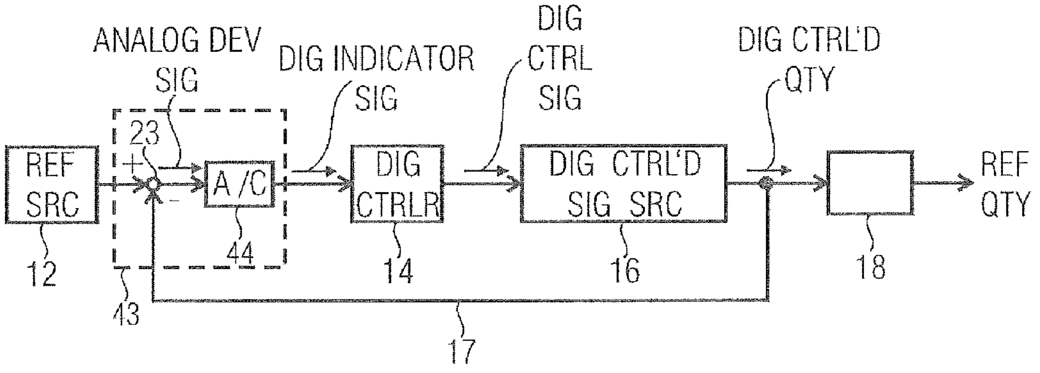
FIG. 4 shows a schematic block diagram of a reference quantity generator according to a fourth embodiment of the teachings disclosed herein.

FIG. 4 shows a schematic block diagram of a reference quantity generator according to a fourth embodiment of the disclosed teachings which is roughly similar to the second embodiment. The reference quantity generator comprises a deviation determiner 43 between the reference source 12 and the digital controller 14. A first input of the deviation determiner 43 is connected to an output of the reference source 12 and a second input of the deviation determiner 43 is connected, via the feedback structure 17, to an output of the digitally controlled signal source 16. As in FIG. 2, the feedback structure 17 could be connected to an output of signal converter 18. The deviation determiner 43 comprises the summing point 23 and an analog-to-digital converter 44. The summing point 23 provides an analog deviation signal to an input of the analog-to-digital converter 44. Typically, the reference source signal and the digitally controlled quantity provided to the summing point 23 via the feedback structure 17 are analog signals, 2. The digital controller 14 receives a digital indicator signal from the analog-to-digital converter 44. The digital indicator signal corresponds to the analog deviation signal in that it is a time-discrete and/or amplitude-discrete representation of the analog deviation signal in a digital format.

The digital controller 14 and the digitally controlled signal source 16 of the reference quantity generator may substantially reduce the noise produced by the reference source 12. At the same time, the digitally controlled quantity and the reference quantity have a high accuracy that may be tracked back to a high accuracy of the reference source 12 when the reference source signal is averaged over time. In other words, the digitally controlled quantity and the reference quantity benefit from the relatively high accuracy of the reference source 12 at a substantially improved noise behavior compared to the reference source 12.

Figure 5:
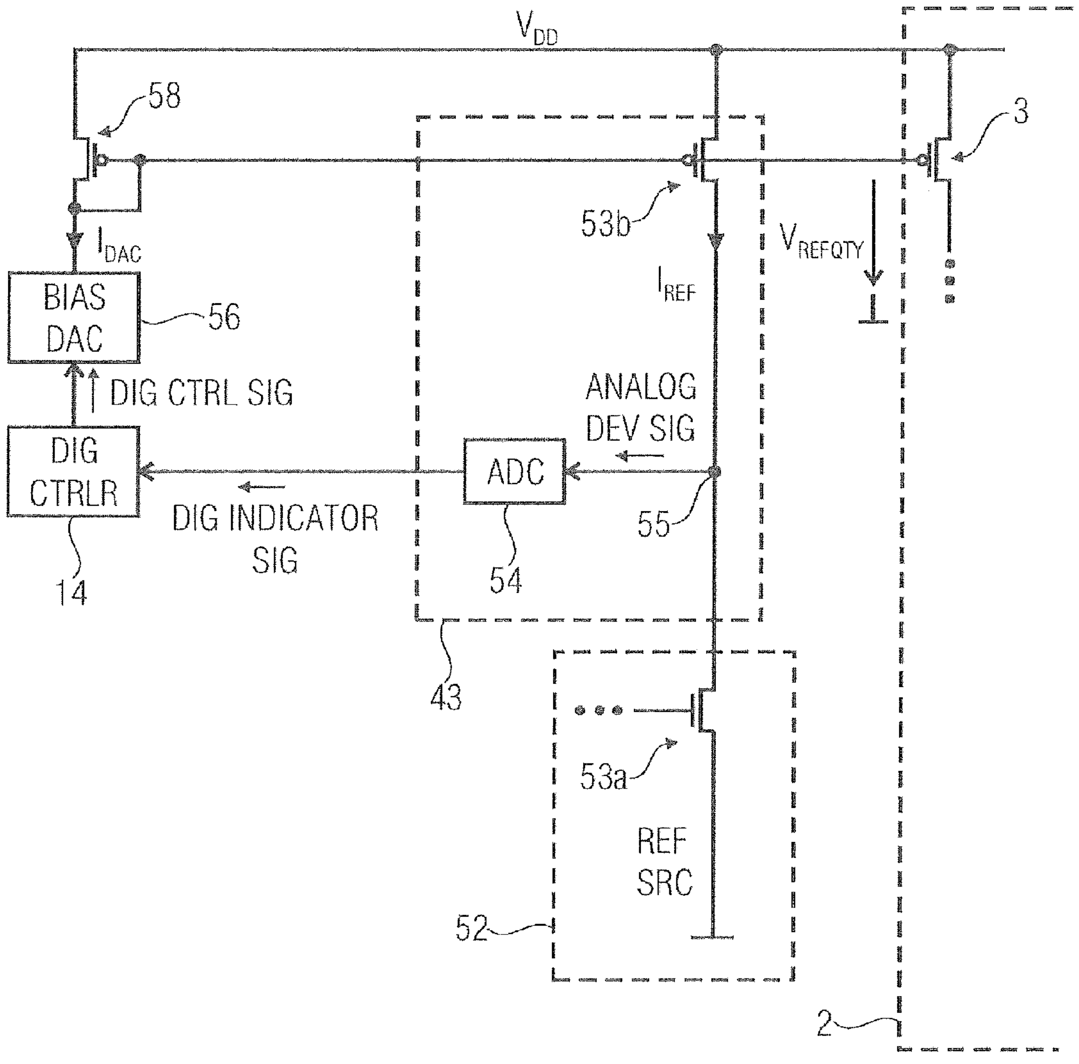
FIG. 5 shows a simplified schematic circuit of a reference quantity generator according to a fifth embodiment of the teachings disclosed herein.

FIG. 5 shows a simplified schematic circuit of a reference quantity generator according to a fifth embodiment of the teachings disclosed herein. The reference source is, in this case, a reference current generator 52. The reference current generator 52 may have one of several possible configurations and some details of the reference current generator 52 are not depicted in FIG. 5. The reference current source 52 then produces a substantially constant reference current $I_{REF}$ which flows through a transistor 53*a* of the reference current source 52. Besides controlling the reference current $I_{REF}$, the transistor 53*a* also has another function as a first comparison transistor as will be explained below. The reference current $I_{REF}$ also flows through a second comparison transistor 53*b*. A sink (or drain) terminal of the first comparison transistor 53*a* is coupled to a sink (or drain) terminal of the second comparison transistor 53*b*. A source terminal of the second comparison transistor 53*b* is connected to a supply voltage $V_{DD}$ and a source terminal of the first comparison transistor 53*a* is connected to a ground potential of the circuit. Assuming that the first comparison transistor 53*a* is substantially symmetrical, in terms of electrical properties, to the second comparison transistor 53*b* and that both transistors 53*a*, 53*b* are biased at their respective control terminals with bias voltages that are symmetric to each other in an electrical sense about a center potential $V_{DD}/2$, then a voltage at a node 55 between the sink terminal of the first comparison transistor 53*a* and the sink terminal of the second comparison transistor 53*b* would be substantially equal to the center voltage $V_{DD}/2$. The reference current source 52 controls the biasing of the first comparison transistor 53*a* in accordance to its task to provide the substantially constant reference value $I_{REF}$. The bias voltage of the second comparison transistor 53*b* is produced by another part of the reference quantity generator which will be explained below. The bias voltage of the second comparison transistor 53*b* may be the reference quantity, a quantity which is proportional to the digitally controlled quantity, or a quantity which is proportional to the reference quantity. Variations of the bias voltages of the first and second comparison transistors 53*a*, 53*b* have repercussions on the voltage at the node 55 between the sink terminals of the first and second comparison transistors 53*a*, 53*b*. These repercussions may be used to assess how good the reference quantity currently tracks the reference source quantity.

The voltage at the node 55 (relative to the ground potential of the circuit) serves as an input signal for an analog-to-digital converter 54. The second comparison transistor 53*b*, the node 55 between the sink terminals of the first and second comparison transistors 53*a*, 53*b*, and the analog-to-digital converter 54 belong to the deviation determiner 43. From a functional point of view, the first comparison transistor 53*a* might be considered to be a part of the deviation determiner 43, as well. The analog-to-digital converter 54 generates a digital indicator signal which is transmitted to the digital controller 14. The digital controller 14 is configured to determine a digital control signal based on the digital indicator signal. An output of the digital controller 14 is connected to an input of a bias digital-to-analog converter (bias DAC) 56. The bias DAC 56 generates an analog signal in the form of an electric current $I_{DAC}$ based on the digital control signal. In the fifth embodiment illustrated in FIG. 5, the current $I_{DAC}$ produced by the bias DAC 56 corresponds to the digitally controlled quantity. Furthermore, the bias DAC 56 thus corresponds to, or is a part of, or comprises, the digitally controlled signal source.

The current $I_{DAC}$ output by the bias DAC 56 flows through a diode-connected transistor 58. Due to the diode-like characteristic of the diode-connected transistor 58, the sink terminal and the control terminal of the transistor 58, which are electrically connected, are pulled to a voltage relative to the supply voltage $V_{DD}$ that depends on the bias DAC output current $I_{DAC}$. In particular, the diode-connected transistor 58 may be a MOS diode which features a relatively low current consumption and a relatively low noise contribution. The control terminal of the transistor 58 has a voltage $V_{REFQTY}$ that may represent the reference quantity in the form of a voltage. The reference quantity voltage $V_{REFQTY}$ may be provided to a consumer 2 that comprises a PMOS transistor 3. The reference quantity voltage $V_{REFQTY}$ is supplied to a control terminal of the PMOS transistor 3. Note that the transistors 58, 53*b* and 3 are depicted as PMOS transistors in FIG. 5. Note that the reference quantity is not necessarily the voltage $V_{REFQTY}$ at the control terminals of the transistors 58, 53*b* and 3, but could in the alternative be a current flowing through the PMOS transistor 3. The three transistors 58, 53*b* and 3 form a current mirror or at least a current mirror-like structure. As explained above, the current $I_{REF}$ flowing through the second comparison transistor 53*b* is imposed by the reference current source 52. Thus, instead of varying the current flowing through the second comparison transistor 53*b*, the second comparison transistor 53*b* modifies its gate-source voltage $V_{GS}$ in order to maintain a valid operating point. As explained above, this results to modifying the voltage at the node 55 between the sink terminals of the first comparison transistor 53*a* and the second comparison transistor 53*b*.

Although the accuracy of the diode-connected transistor or MOS diode 58 typically is poor, this poor accuracy may be compensated by a digital calibration provided for by the deviation determiner 43, the digital controller 14 and the bias DAC 56.

Figure 6:
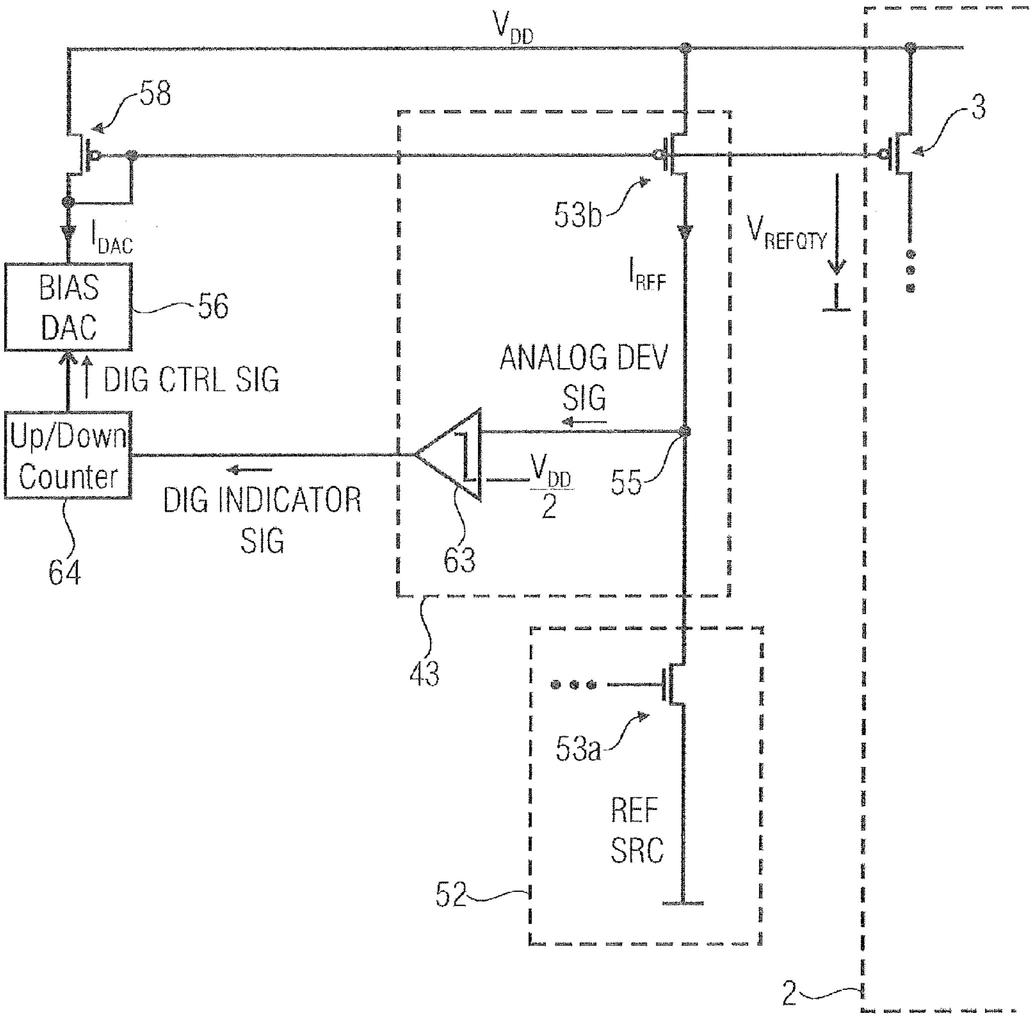
FIG. 6 shows a simplified schematic circuit of a reference quantity generator according to a sixth embodiment of the teachings disclosed herein.

FIG. 6 shows a simplified schematic circuit of a reference quantity generator according to a sixth embodiment of the disclosed teachings which has similarities with the fifth embodiment. Differences between the fifth embodiment and the sixth embodiment lie in the structure of the deviation determiner 43 and the digital controller. In the sixth embodiment the deviation determiner 43 comprises a comparator 63 which serves as the analog-to-digital converter. The comparator 63 comprises two inputs and one output. One of the inputs of the comparator 63 is connected to the node 55 between the sink terminals of the first comparison transistor 53*a* and the second comparison transistor 53*b*. Another input of the comparator 63 is connected to a threshold signal, for example in the form of a voltage $V_{DD}/2$. Note that the value $V_{DD}/2$ that has been chosen in this example corresponds to the case in which the first comparison transistor 53*a* and the second comparison transistor 53*b* form an electrically symmetric structure between the supply voltage $V_{DD}$ and the ground potential, including their respective bias voltages applied to the control terminal of the first comparison transistor 53*a* and the control terminal of the second comparison transistor 53*b*, respectively. Nevertheless, the threshold signal might also assume values different than $V_{DD}/2$.

The digital indicator signal produced by the comparator 63 is a binary signal that indicates whether the analog deviation signal, i.e., the voltage at the node 55, is higher or lower than the threshold signal, i.e., the voltage $V_{DD}/2$. The digital indicator signal is provided to an up/down counter 64 serving as the digital controller in the embodiment depicted in FIG. 6. Depending on an instantaneous value of the digital indicator signal ("high" or "low"), the up-and-down counter 64 increases or decreases a digital output value of the up-and-down counter 64. Increasing and decreasing the digital output value typically happens in a digital unit step manner. The up-and-down counter 64 is typically clocked and comprises a clock input (not shown) and the up-and-down counter 64 may be configured to perform one increment or decrement of the digital output value per clock cycle. Hence, the up-and-down counter 64 is configured to alter the digital output value by an upward or downward digital unit step based on the comparator output signal, i.e., the digital indicator signal. In a stationary mode, the up-and-down counter 64 alters the digital output value by toggling two adjacent digital values. Accordingly, the bias DAC 56 generates a slightly oscillating output current $I_{DAC}$. By action of the structure formed by the two PMOS transistors 58 and 53*b* and the NMOS transistor 53*a*, the variations of the bias DAC output current $I_{DAC}$ also cause variations of the voltage at the node 55 between the sink terminals of the first and second comparison transistors 53*a*, 53*b*. In the stationary mode, these variations would cause the voltage at the node 55 to oscillate around the threshold value, e.g., $V_{DD}/2$. Furthermore, the oscillation of the digital output value of the up-and-down counter 64 typically also leads to corresponding oscillations of the reference quantity, e.g., $V_{REFQTY}$. Typically, an amplitude of the oscillation corresponds to a least significant bit (LSB) of the bias DAC 56. For some applications an oscillation of the reference quantity on the order of the least significant bit of the digital-to-analog converter may be acceptable. The oscillation may also be acceptable if it has a relatively low frequency, such as 0.1 Hz. The frequency of the oscillation is typically related to a frequency of the digital calibration, i.e. how often the digital calibration is performed. For other applications and/or in case the digital calibration is performed at a frequency where it could cause a degradation of the reference quantity, it may be desired to suppress these oscillations as far as possible. One option according to an alternative embodiment would be to provide the comparator 63 with a hysteresis, or to use a Schmitt trigger instead of the comparator 63. This may cause the reference quantity to be offset from a desired value by a deviation corresponding to +/−½ LSB, at the most.

Figure 7:
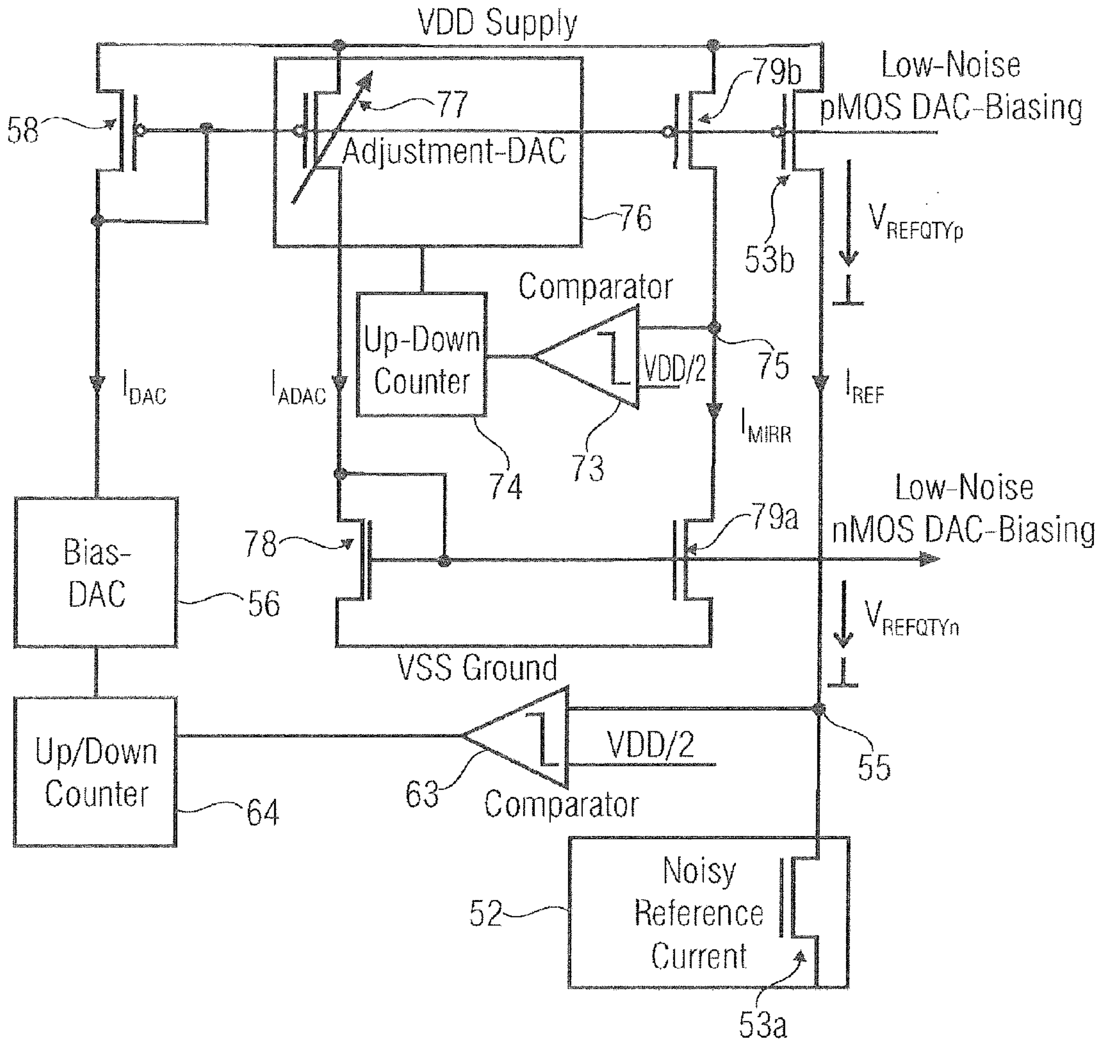
FIG. 7 shows a simplified schematic circuit of a reference quantity generator according to a seventh embodiment of the teachings disclosed herein.

FIG. 7 shows a simplified schematic circuit of a reference quantity generator according to a seventh embodiment of the teachings disclosed herein, that is configured to generate two reference quantities, in this case a first reference voltage $V_{REFQTYp}$ to be used as a low-noise pMOS DAC biasing, and a second reference voltage $V_{REFQTYn}$ to be used as a low-noise nMOS DAC biasing. The structure of the reference quantity generator used for generating the first reference voltage $V_{REFQTYp}$ corresponds to the reference quantity generator according to the sixth embodiment shown in FIG. 6. In addition, the reference quantity generator according to the seventh embodiment comprises a similar structure for generating the second reference voltage $V_{REFQTYn}$ which in the illustration of FIG. 7 is graphically represented as an inner loop within the reference quantity generation structure for the first reference voltage $V_{REFQTYp}$. The inner reference quantity generation loop is connected to the outer reference quantity generation loop of the reference quantity generator by means of circuit arrangements that resemble or correspond to current mirrors. The inner reference quantity generation loop is cascaded with the outer reference quantity generation loop. The reference current source 52 serving as the reference source acts on the inner reference quantity generation loop by intermediary of the outer reference quantity generation loop. Thus, the two reference quantities $V_{REFQTYp}$ and $V_{REFQTYn}$ may be highly coherent to each other.

The inner reference quantity generation loop comprises a first comparison transistor 79*a* and a second comparison transistor 79*b*. The inner reference quantity generation loop further comprises a diode-connected transistor 78, e.g., a MOS diode, and an adjustment digital-to-analog converter (adjustment DAC) 76. The inner reference quantity generation loop further comprises a comparator 73 and an up-and-down counter 74. The second comparison transistor 79*b* forms a current mirror-like arrangement with the MOS diode 58, a pMOS transistor 77 of the adjustment DAC, and the second comparison transistor 53*b* of the outer reference quantity generation loop. The control terminals of the four pMOS transistors 58, 77, 79*b* and 53*b* are connected together and their voltage relative to the circuit ground potential is the first reference voltage $V_{REFQTYp}$. A mirror current $I_{MIRR}$ through the second comparison transistor 79*b* of the inner reference quantity generation loop is a function of the gate-source voltage of the second comparison transistor 79*b*. The mirror current $I_{MIRR}$ also flows through the first comparison transistor 79*a* which forms a current mirror-like arrangement with the diode-connected transistor, or MOS diode, 78. The current $I_{ADAC}$ flowing through the diode-connected transistor 78 is largely imposed by the pMOS transistor 77 of the adjustment DAC 76. By means of the diode-connected transistor 78 the adjustment DAC current $I_{ADAC}$ is converted to a gate source voltage in accordance with the diode-like characteristic of the diode-connected transistor 78. The voltage between the control terminal or gate of the diode-connected transistor 78 and the circuit ground $V_{ss}$ ground is also the second reference voltage $V_{REFQTYn}$. In a similar manner as the first comparison transistor 53*a* and the second comparison transistor 53*b* of the outer reference quantity generation loop, the first comparison transistor 79*a* and the second comparison transistor 79*b* of the inner reference quantity generation loop may find a common operating point resulting in a particular voltage of a node 75 between a sink terminal of the first comparison transistor 79*a* and a sink terminal of the second comparison transistor 79*b*, i.e., the source of pMOS transistor 79*b* and the drain of nMOS transistor 79*a*. The voltage at the node 75 is sensed by the comparator 73 and compared to the threshold voltage $V_{DD}/2$. A digital indicator signal output by the comparator 73 depends on whether an analog deviation signal corresponding to the voltage at the node 75 is higher than the threshold in $V_{DD}/2$. The up-and-down counter 74 is configured to receive the binary indicator signal from the comparator 73 and to increment or decrement a digital output value of the up-and-down counter 74 depending on whether the binary indicator signal is currently "high" or "low". The adjustment DAC 76 is controlled using the digital output value of the up-and-down counter 74. Altering the input value for the adjustment DAC 76 leads to a variation of the adjustment DAC current $I_{ADAC}$, which further leads to a variation of the second reference voltage $V_{REFQTYn}$ and, via the first comparison transistor 79*a* and the second comparison transistor 79*b*, to a variation of the voltage at the node 75. In this manner, the inner reference quantity generation loop tracks the first reference voltage $V_{REFQTYp}$ and also variations caused by e.g., the adjustment DAC 76 due to temperature variations, aging effects, etc.

Another explanation of the reference quantity generator according to the seventh embodiment shown in FIG. 7 is presented now. The reference quantity generator (digital calibrator reference generation) depicted in FIG. 7 comprises a bias DAC 56 which is digitally controlled by an up-and-down counter 64. The bias DAC 56 is connected to a pMOS diode 58. The pMOS diode 58 generates the bias voltage for a consumer (not shown) which may comprise pMOS DACs, for example. The pMOS diode 58 also provides a bias voltage for the adjustment DAC 76. The adjustment DAC 76 is connected to an nMOS diode 78. The nMOS diode 78 and nMOS transistor 79*a* form a current mirror. The current of the nMOS transistor 79*a* is calibrated via the adjustment DAC 76 until it matches the current of a pMOS transistor 79*b*. The comparator 73 is clocked and compares the output currents of the pMOS transistor 79*b* and the nMOS transistor 79*a*. If the current of the pMOS transistor 79*b* is larger than that of the nMOS transistor 79*a*, the comparator 73 provides a one or "high" at its output. In case of a comparator output signal having the value one or "high", the up-and-down counter 74 counts up, i.e., increments the digital output value. In the case when a current of the pMOS transistor 79*b* is smaller than a current of the nMOS transistor 79*a*, the counter 74 counts down, i.e., decrements the digital output value. The counter 74 counts in a unit stepwise manner corresponding to the comparator output. The same scheme is applied to calibrate the pMOS transistor 53*b* to match the noisy reference current $I_{REF}$ provided by the noisy reference current source 52 via the comparator 63, the up-and-down counter 64 and the bias DAC 56.

Figure 8:
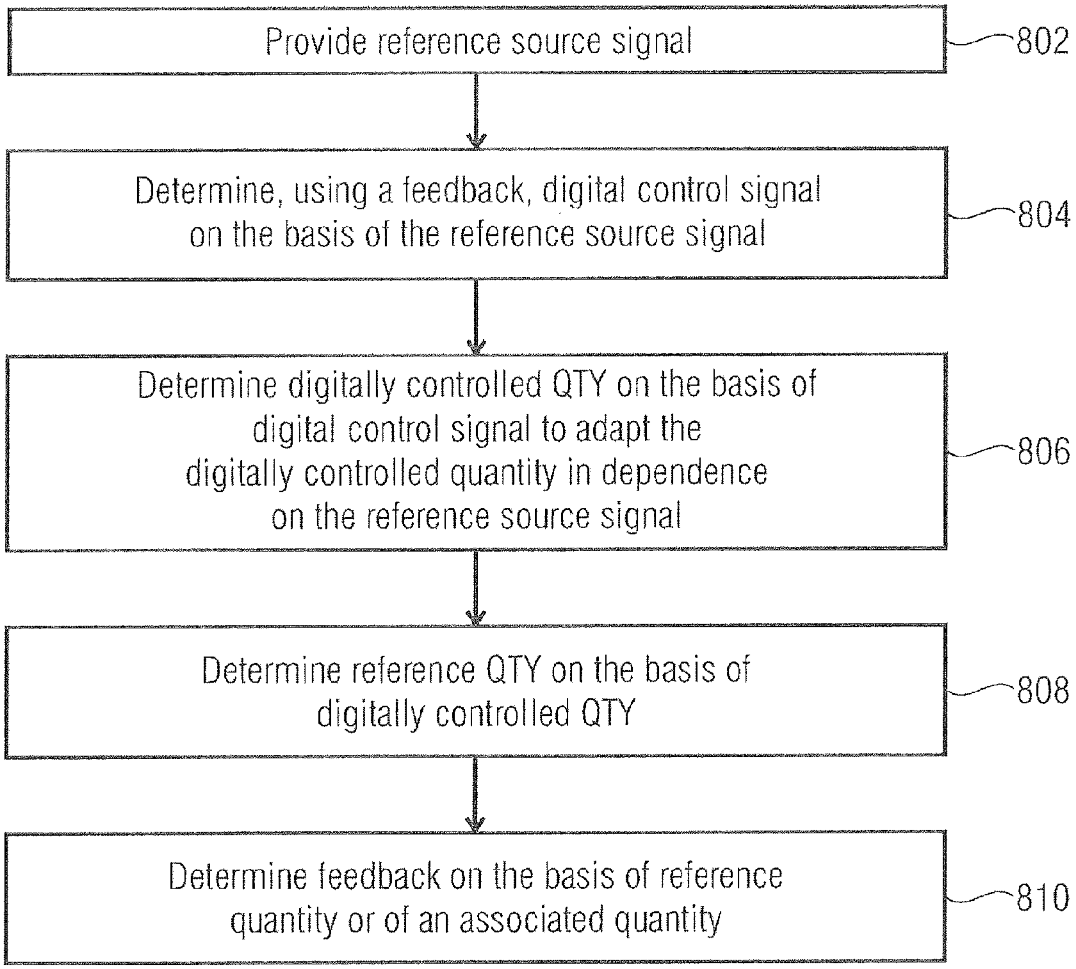
FIG. 8 shows a schematic flow diagram of a method for generating a reference quantity according to an embodiment of the teachings disclosed herein.

FIG. 8 shows a schematic flow diagram of a method for generating a reference quantity according to a first embodiment of the teachings disclosed herein. The method begins with providing a reference source signal as illustrated by a block with the reference numeral 802. At 804 a digital control signal is determined based on the reference source signal. The determination of the digital control signal involves, in one embodiment, using a feedback. A block 806 of the schematic flow diagram illustrates that a digitally controlled quantity is determined based on the digital control signal. This is done to adapt the digitally controlled quantity based on the reference source signal. At 808, the reference quantity is determined based on the digitally controlled quantity. The reference quantity may be identical to the digitally controlled quantity in one embodiment, in which case the digitally controlled quantity is output as the reference quantity. In this case, the determination of the reference quantity based on the digitally controlled quantity is simply an identity operation. In other cases, the determination of the reference quantity may involve a conversion of the digitally controlled quantity, such as a current-to-voltage conversion, a voltage-to-current conversion, an amplification, an addition of an offset, etc. A further action of the method for generating the reference quantity is illustrated by a block 810 of the schematic flow chart shown in FIG. 8 and relates to a determination of the feedback that is used in the context of the action 804 of determining the digital control signal. The feedback is determined based on the reference quantity or on a quantity that is associated to the reference quantity.

The digital control signal may represent a digital calibration of the generation of the reference quantity relative to the reference source signal. The digital calibration may compensate a poor accuracy of components that are used, for example, in the context of the action 808 of determining the reference quantity based on the digitally controlled quantity, or in the context of other actions of the method for generating the reference quantity.

The method may further comprise a determination of a deviation of the digitally controlled quantity or of the reference quantity relative to the reference source signal. The feedback for determining the digital control signal may be provided based on the deviation. Determining the deviation may comprise an analog-to digital conversion of an analog deviation signal indicative of the deviation to obtain a digital indicator signal supplied to the digital controller.

The determination of the digital control signal may comprise a comparison of a comparator input signal with a threshold signal to provide a comparison result. The comparator input signal may be indicative of a deviation between the reference source signal and at least one of the digitally controlled quantity and the reference quantity. The digital output value of the up-and-down counter may be increased or decreased based on the comparison result. Subsequently, a digital-to-analog conversion of the digital output value may be performed by means of the bias DAC 56 or the adjustment DAC 76 to provide the digitally controlled quantity.

The digitally controlled quantity may have a lower noise measure than the reference source signal. A focus of the reference source signal generation may be to provide good or superior accuracy of the reference source signal when averaged over time. The good or superior accuracy of the reference source may be at the cost of a higher noise measure. For most applications a constant reference source signal is needed. Variations of the reference source signal about the constant value may typically be considered as noise. A noise measure may be a root-mean-square (RMS) value of these variations around the constant reference source signal value, or a power of the variation, in particular an average power within a certain time interval. Especially reference sources that are based on band gap reference sources may be prone to produce significant noise and thus have a relatively high noise measure, i.e., a poor noise performance. In a further embodiment, the method may provide a further reference quantity in addition to the reference quantity which has been mentioned above. A further digitally controlled quantity may be provided as a basis for a determination of the further reference quantity. A further digital control signal for controlling the provision of the further digitally controlled quantity based on the reference source signal may also be provided. A further feedback may be used to provide the further digital control signal. The (first) reference quantity and the further reference quantity are both derived from the same reference source signal.

The reference source signal may be one of a voltage signal and a current signal and the reference quantity may be one of a voltage and a current.

Figure 9:
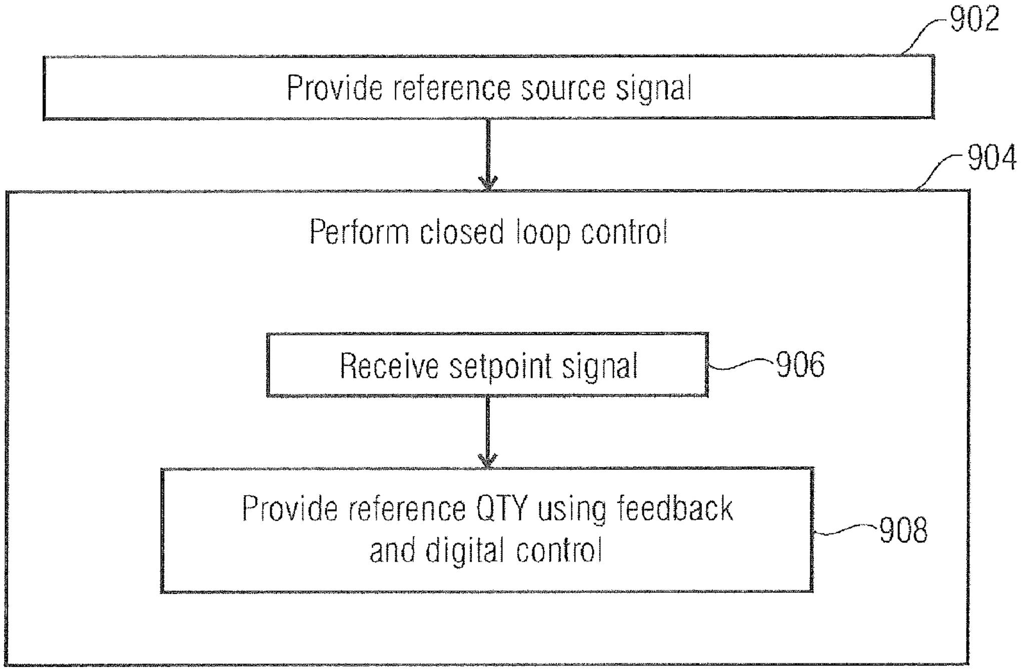
FIG. 9 shows a schematic flow diagram of a method for generating a reference quantity according to another embodiment of the teachings disclosed herein.

FIG. 9 shows a schematic flow diagram of a method for generating a reference quantity according to a second embodiment of the teachings disclosed herein. The method begins with providing a reference source signal at an action 902. Then a closed loop control 904 is performed which makes use of an analog-and-digital control loop. The closed loop control 904 comprises receiving a setpoint signal at an action 906 and providing the reference quantity in the context of an action 908. The setpoint signal is a function of the reference source signal and possibly of another signal obtained by means of a feedback. The reference quantity is provided using a feedback and a digital control. A noise measure of the analog-and-digital control loop is lower than a noise measure of the reference source signal. In this manner, a good or even superior accuracy of the reference source signal may be combined with a low noise measure proper to the analog-and-digital control loop. This finding may also be true for the method for generating a reference quantity according to the first embodiment and for the reference quantity generator according to various embodiments disclosed herein.

FIGS. 10 to 13 illustrate a possible application of a reference quantity generator according to the teachings disclosed herein. The possible application relates to receivers for wireless signals which may be found in a large number of devices.

Figure 10:
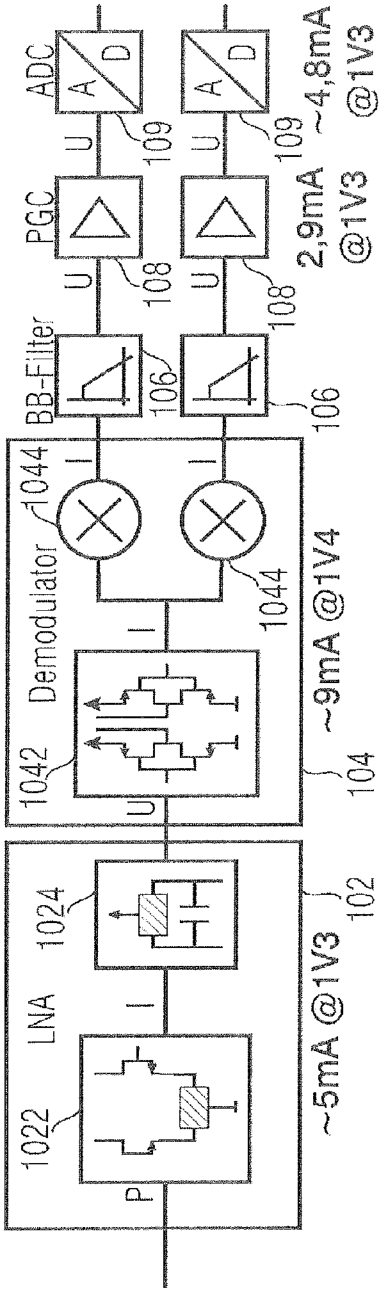
FIG. 10 shows a schematic block diagram of a receiver for GSM/EGDE/UMTS in which or for which a reference quantity generator according to the teachings disclosed herein may be used.

A structure of a wireless receiver is shown in FIG. 10 in schematic block diagram form. The receiver comprises an inductively degenerated low noise amplifier (LNA) 102 which comprises an active stage 1022 and a LC-tank 1024 as a load. The low noise amplifier 102 is designed for a current consumption of approximately 5 mA at 1.3 volt. The LC-tank 1024 is differentially connected to a LNA transconductance stage 1042 which is part of a demodulator 104. The output of the LNA transconductance stage 1042 is connected to I/Q mixers 1044 that are terminated by base band filters 106. A programmable gain control (PGC) 108 is used for signal leveling in case the receiver is used to receive UMTS (Universal Mobile Telecommunications System). In narrow band systems like GSM/EDGE (Global System for Mobile Communications/Enhanced Data Rates for GSM Evolution) or CDMA 2000 (Coded Division Multiple Access 2000), the base band filter is used to relax the requirements to be met by an analog-to-digital converter of the receiver with respect to signal-to-noise ratio (SNR) and/or signal-to-noise and distortion ratio (SN DR). In these standards, a number of test scenarios are defined. According to two types of test scenarios, a reference sensitivity and an inter-modulation behavior of the receiver is tested. In the GSM/EDGE system depicted in FIG. 10, the base band filter 106 provides 27 dB suppression in the 3 MHz inter-modulation test case, which directly leads to a relaxation by 27 dB of the SNR/SNDR to be met by the analog-to-digital converter for the reference sensitivity and the inter-modulation case. The SNR/SNDR requirements for the analog-to-digital converter are shown in the table below for the lineup of FIG. 10 (with base band filter) and FIG. 11 (without base band filter and no filtering in the signal transfer function (STF)).

Figure 11:
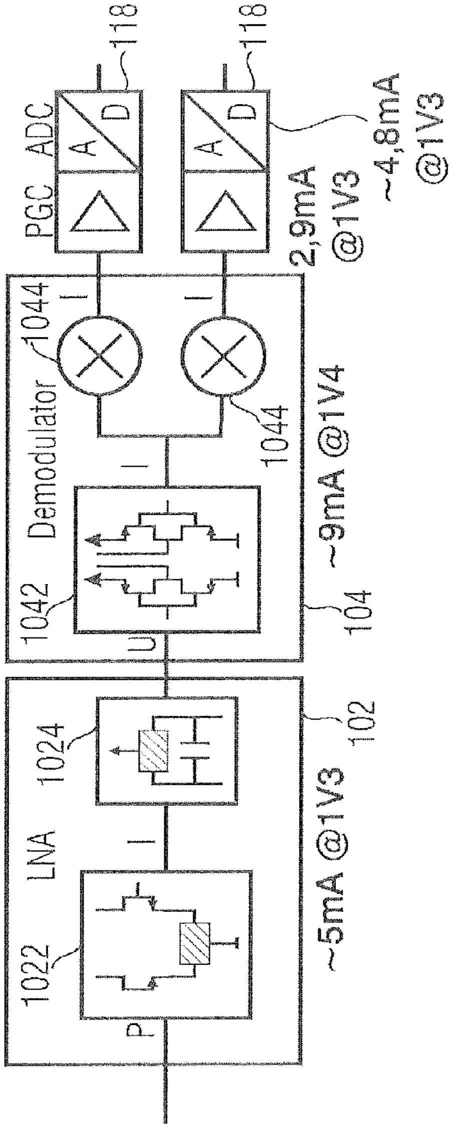
FIG. 11 shows a schematic block diagram of another receiver having a base-band filter-less receiver lineup in which or for which a reference quantity generator according to the teachings disclosed may be used.

The receiver lineup shown in FIG. 11 differs from the receiver shown in FIG. 10 in that the voltage interface in between the programmable gain control 108 and the analog-to-digital converter 109 is replaced by a current interface. The programmable gain control is incorporated in the analog-to-digital converter 118 via a programmable feedback-DAC biasing.

GSM/EDGE as Example of Narrow Band System

| Standard | Case | Attenuation BB_Filter | 1.pole fc | ADC SNR/SNDR |
|---|---|---|---|---|
| 2G | Ref Sens | 0 dB | 20 MHz | 110 dB |
| 2G | Ref Sens | −27 dB | 120 MHz | 83 dB |
| 2G 6 dB Gain Step | Ref Sens | 0 dB | 20 MHz | 104 dB |
| 2G 6 dB Gain Step | Ref Sens | −27 dB | 120 MHz | 77 dB |
| 2G | 3 MHz Blocker | 0 dB | 20 MHz | 88 dB |
| 2G | 3 MHz Blocker | −27 dB | 120 MHz | 61 dB |

The above table summarizes the requirements to be met by an analog-to-digital converter 109, 118 in a receiver lineup with and without base band filter. As can be seen in the table, the relaxation of the base band filter attenuation is directly converted in increased SNR/SNDR requirements for the analog-to-digital converter 118. In the example of the table, the SNR/SNDR specification increases by 27 dB. In this context, it would be desirable to provide an analog-to-digital converter which has 104 dB/110 dB SNR at 135 kHz bandwidth.

One option to meet this desire is to design a continuous-time sigma-delta analog-to-digital converter which has a capability of 88 dB SNDR in the blocker test case. Additionally, the continuous-time sigma-delta analog-to-digital converter should be capable of increasing the SNR performance by 16 dB in the reference sensitivity test case. The overall noise budget is determined by quantization noise, thermal noise in feedback digital-to-analog converter and integrator amplifier while, in addition, the clock jitter contributes to the overall noise budget as well. Thus, an ultra low noise current steering digital-to-analog converter reference for a specific feedback DAC topology is required. Usually, the quantization and clock jitter induced noise is 10 dB below the thermal noise, which is dominated by the feedback DAC. One factor that influences the noise behavior of the feedback DAC is the noise contained in the supply voltage and/or the supply current for the feedback DAC. The teachings disclosed herein relate to an ultra low noise reference generation for a current steering feedback DAC, which is digitally calibrated for accuracy improvement. The ultra low noise reference generation is achieved by the reference quantity generator and the method for generating a reference quantity according to the teachings disclosed herein. The reference quantity generator and the method for generating a reference quantity are not limited to applications like digital-to-analog converters and charge pumps. In general, it could be used for accurate, ultra low noise and fast regulating biasing similar to reference generations for DACs.

Designing an analog-to-digital converter with a resolution of 104 dB/110 dB SNR with reasonable current consumption presents a challenge. In order to circumvent this challenge, in solutions that do not make use of the teachings disclosed herein, for example the receiver lineup with base band filtering depicted in FIG. 10 is used with the known disadvantages of large filtering capacitances for narrow band systems like GSM/EDGE and an additional amplifier in the base band filter 106.

According to the reference generation of the teachings disclosed herein, simple MOS diodes are used at least in some embodiments. MOS diodes have low current consumption and noise contribution. The poor accuracy which is typically exhibited by MOS diodes is compensated by digital calibration.

According to the teachings disclosed herein, a relatively noisy reference generation or reference source is provided which has, however, relatively high accuracy. A reference produced by the reference generation or reference source is used to calibrate a low noise and low accuracy reference. Typically, the calibration has to be applied seldom because temperature or other factors change an operation point of e.g., a transistor slowly.

Figure 12:
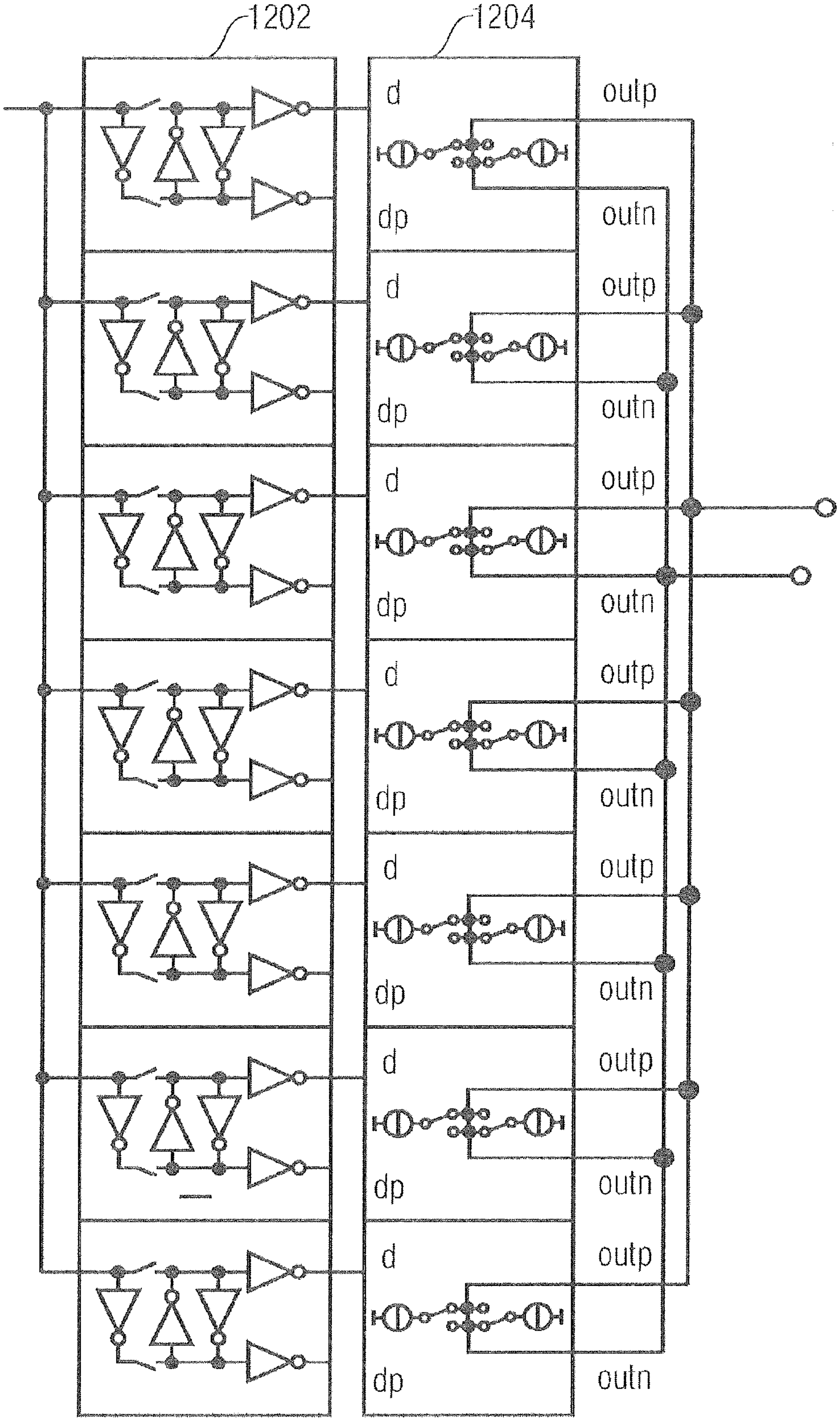
FIG. 12 shows a simplified schematic circuit of a 3-bit digital-to-analog converter that may be used in a receiver architecture as illustrated in FIGS. 10 and 11 and that may employ one or more reference quantity generators according to the teachings disclosed herein.
Figure 13:
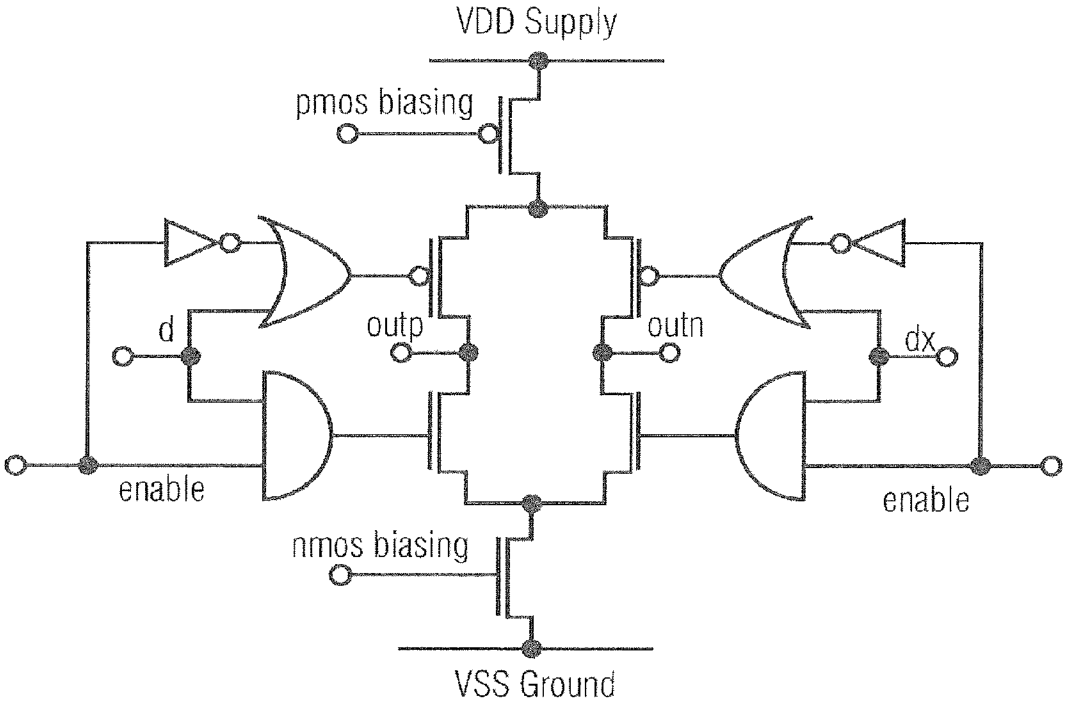
FIG. 13 shows a simplified schematic circuit of a digital-to-analog converter cell.

In FIG. 12, a three-bit current steering feedback DAC is shown. The three-bit DAC comprises seven latches 1202 and 7 current cells 1204. Each DAC cell has its own latch. As mentioned above, the feedback DAC should have the ability to increase the noise performance by 16 dB in the reference sensitivity case, which is only possible to achieve when unused DAC cells are switched. Therefore, the DAC cells shown in FIG. 13 have the capability to be switched off if it is unused by means of an enable signal. With the technique of switching off unused DAC cells and the digitally calibrated reference generation, a signal-to-noise ratio of 110 dB becomes feasible.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. In addition, various elements or features of one embodiment may be incorporated in various other disclosed embodiment. It is the intent, therefore, to be limited only by the scope of the impending patent claims and not by the specific details presented by way of description and explanation of the embodiments herein.

What is claimed is:

1. A reference quantity generator configured to generate a reference quantity, the reference quantity generator comprising:

a reference source configured to provide a reference source signal;

a digitally controlled signal source configured to provide a digitally controlled quantity, wherein the reference quantity is based on the digitally controlled quantity, wherein the digitally controlled signal source comprises a comparator configured to compare a comparator input signal with a threshold signal, the comparator input signal being indicative of a quantitative relation between the reference source signal and at least one of the digitally controlled quantity and the reference quantity; and a digital controller configured to provide a digital control signal to control the digitally controlled signal source to adapt the digitally controlled quantity based on the reference source signal using a feedback, wherein the digital controller comprises an up-and-down counter configured to receive a comparator output signal from the comparator and generate a digital output value, wherein the up-and-down counter is configured to alter the digital output value by an upward or downward digital unit step based on the comparator output signal, wherein the digitally controlled signal source comprises a digital-to-analog converter configured to receive the digital output value from the up-and-down counter and generate the digitally controlled quantity based on the digital output value.

2. The reference quantity generator according to claim 1, wherein the digital controller is configured to provide the digital control signal in order to digitally calibrate the reference quantity generator relative to the reference source signal.

3. The reference quantity generator according to claim 1, wherein the digitally controlled signal source has a lower noise measure than the reference source.

4. The reference quantity generator according to claim 1, further comprising:

a further digitally controlled signal source configured to provide a further digitally controlled quantity as a basis for a determination of a further reference quantity provided by the reference quantity generator; and a further digital controller configured to provide a further digital control signal for controlling the further digitally controlled signal source to adapt the further digitally controlled quantity based on the reference source signal using a further feedback.

5. The reference quantity generator according to claim 4, wherein the further digital controller is configured to receive a feedback signal that represents a quantitative relation between the further digitally controlled quantity and a reference signal that is derived from the digitally controlled quantity and adjust the further digital control signal based on the feedback signal such that a dependent control loop comprising the further digital controller and the further digitally controlled signal source is configured to control the further digitally controlled quantity based on the digitally controlled quantity provided by the digital controller.

6. The reference quantity generator according to claim 5, further comprising a multiple current mirror configured to mirror the digitally controlled quantity, or a quantity that is proportional to the digitally controlled quantity, to provide a first mirrored signal and a further mirrored signal, wherein the digital controller is configured to receive the feedback signal that depends on the first mirrored signal and wherein the further digital controller is configured to receive the further feedback signal that depends on the further mirrored signal.

7. The reference quantity generator according to claim 1, further comprising a current mirror forming part of a feedback structure to provide the feedback to the digital controller.

8. The reference quantity generator according to claim 1, wherein the reference source signal is one of a reference source voltage signal and a reference source current signal, and wherein the reference quantity is one of a reference voltage and a reference current.

9. A reference quantity generator configured to generate a reference quantity, the reference quantity generator comprising:

a reference source configured to provide a reference source signal;

a digitally controlled signal source configured to provide a digitally controlled quantity, wherein the reference quantity is based on the digitally controlled quantity; and a digital controller configured to provide a digital control signal to control the digitally controlled signal source to adapt the digitally controlled quantity based on the reference source signal using a feedback provided at a feedback node, wherein the reference source is a current source having a current source transistor which serves as a first comparison transistor and wherein the reference quantity generator comprises a second comparison transistor, wherein a control terminal of the second comparison transistor is coupled to an output of the digitally controlled signal source such that a control voltage of the second comparison transistor is determined by the digitally controlled quantity, wherein a sink terminal of the first comparison transistor is coupled to a sink terminal of the second comparison transistor to form the feedback node, and wherein the reference quantity generator is configured to increase or decrease the digital control signal based on a voltage at the feedback node between the sink terminal of the first comparison transistor and the sink terminal of the second comparison transistor.

10. A reference quantity generator configured to generate a reference quantity, comprising:

a reference source configured to provide a reference source signal; and an analog-and-digital control loop configured to receive an analog setpoint signal that is a function of the reference source signal or that is equal to the reference source signal, and provide the reference quantity using a feedback and a digital control, wherein a noise measure of the analog-and-digital control loop is lower than a noise measure of the reference source, wherein the analog-and-digital control loop comprises:

an analog-to-digital converter configured to convert the analog setpoint signal to a digital indicator signal;

a digital controller configured to generate a digital control signal based on the digital indicator signal;

a digital-to-analog converter configured to generate an analog control signal based on the digital control signal; and an analog signal processing chain configured to generate the analog setpoint signal based on the analog control signal.

11. The reference quantity generator according to claim 10, wherein the analog-and-digital control loop is a main control loop, and wherein the reference quantity generator comprises a further analog-and-digital control loop configured to provide a further reference quantity and receive a further setpoint signal derived from the main control loop so that the further analog-and-digital control loop follows the analog-and-digital control loop.

12. A method for generating a reference quantity, the method comprising:

providing a reference source signal;

determining, using a feedback, a digital control signal based on the reference source signal;

determining a digitally controlled quantity based on the digital control signal; and determining the reference quantity based on the digitally controlled quantity;

wherein the feedback is based on the reference quantity or an associated quantity and provided to adapt the digitally controlled quantity based on the reference source signal, wherein determining the digital control signal comprises:

comparing a comparator input signal with a threshold signal to provide a comparison result, the comparator input signal being indicative of a deviation between the reference source signal and at least one of the digitally controlled quantity and the reference quantity;

increasing or decreasing a digital output value of an up-and-down counter based on the comparison result; and performing a digital-to-analog conversion of the digital output value to provide the digitally controlled quantity.

13. The method according to claim 12, wherein providing the digital control signal represents a digital calibration of the generation of the reference quantity relative to the reference source signal.

14. The method according to claim 13, further comprising:

determining a deviation of the digitally controlled quantity or of the reference quantity relative to the reference source signal; and providing the feedback for determining the digital control signal based on the deviation.

15. The method according to claim 14, wherein determining the deviation comprises performing an analog-to-digital conversion of an analog deviation signal indicative of the deviation to obtain a digital feedback signal supplied to a digital controller.

16. The method according to claim 12, wherein the digitally controlled quantity has a lower noise measure than the reference source signal.

17. The method according to claim 12, further comprising:

providing a further digitally controlled quantity as a basis for a determination of a further reference quantity; and providing a further digital control signal for controlling the provision of the further digitally controlled quantity based on the reference source signal using a further feedback.

18. The method according to claim 12, wherein the reference source signal is one of a voltage signal and a current signal and wherein the reference quantity is one of a voltage and a current.

* * * * *